(12) United States Patent
Biron

(10) Patent No.: US 6,603,079 B2
(45) Date of Patent: *Aug. 5, 2003

(54) PRINTED CIRCUIT BOARD ELECTRICAL INTERCONNECTS

(75) Inventor: Richard M. Biron, Melbourne, FL (US)

(73) Assignee: Mack Technologies Florida, Inc., West Melbourne, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/244,801

(22) Filed: Feb. 5, 1999

(65) Prior Publication Data

US 2001/0042636 A1 Nov. 22, 2001

(51) Int. Cl.⁷ ................................................. H05K 1/00
(52) U.S. Cl. ........................ 174/254; 174/261; 174/262
(58) Field of Search .................. 439/493, 67; 361/789, 361/803, 749, 750, 757; 174/254, 255, 117 FF, 72 A, 261, 262–266

(56) References Cited

U.S. PATENT DOCUMENTS

| | | | | |
|---|---|---|---|---|
| 4,687,695 A | * | 8/1987 | Hamby | 428/192 |
| 4,843,191 A | * | 6/1989 | Thomas | 174/88 R |
| 5,091,826 A | * | 2/1992 | Arnette et al. | 174/261 |
| 5,093,985 A | * | 3/1992 | Houldsworth et al. | 29/830 |
| 5,177,863 A | * | 1/1993 | Lam | 29/830 |
| 5,306,874 A | | 4/1994 | Biron | 174/262 |
| 5,346,401 A | * | 9/1994 | Delianides et al. | 439/67 |
| 5,419,038 A | * | 5/1995 | Wang et al. | 29/830 |
| 5,446,239 A | * | 8/1995 | Mizutani et al. | 174/36 |
| 5,482,473 A | * | 1/1996 | Lord et al. | 439/67 |
| 5,523,695 A | * | 6/1996 | Lin | 324/755 |
| 5,598,627 A | * | 2/1997 | Saka et al. | 29/861 |
| 5,872,338 A | * | 2/1999 | Lan et al. | 174/255 |

* cited by examiner

*Primary Examiner*—Albert W. Paladini
*Assistant Examiner*—Jeremy Norris
(74) *Attorney, Agent, or Firm*—Rutan & Tucker LLP; Robertq D. Fish; David J Zoetewey

(57) ABSTRACT

A device used in the formation of interconnected printed circuit boards and the like, the device comprising a rigid dielectric layer; a window in the dielectric layer; and at least two interconnects. Each of the at least two interconnects has a first segment bonded to the dielectric layer on a first side of the window, and a second segment bonded to the dielectric layer on a second side of the window. A portion of the each of the at least two interconnects located between the first and second segments extends across the window between the first and second sides of the window. The interconnects do not cover the entire window.

10 Claims, 5 Drawing Sheets

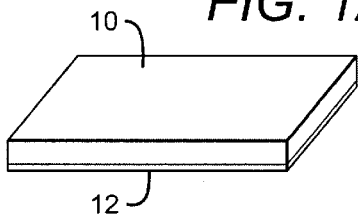
FIG. 1A
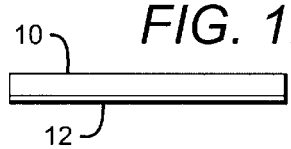
FIG. 1B
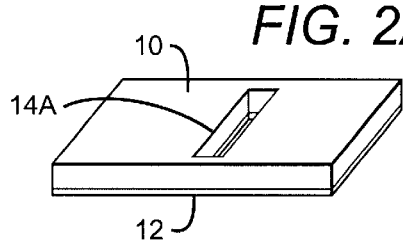
FIG. 2A
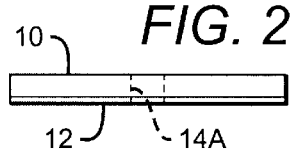
FIG. 2B
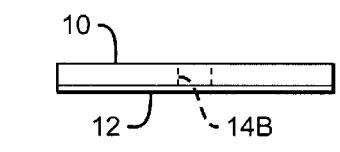
FIG. 2C
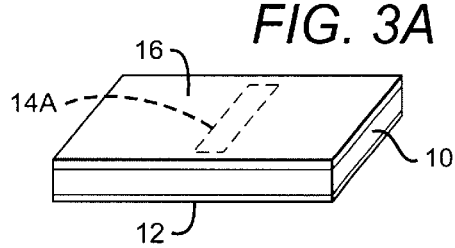
FIG. 3A
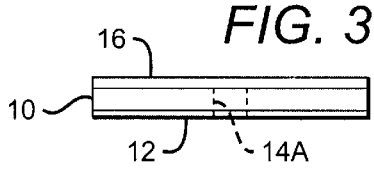
FIG. 3B
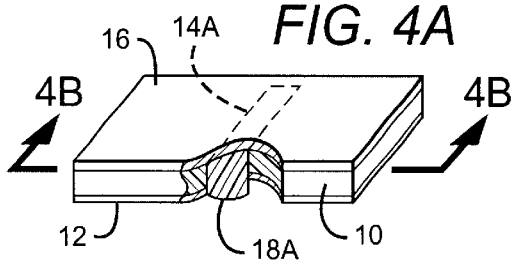
FIG. 4A
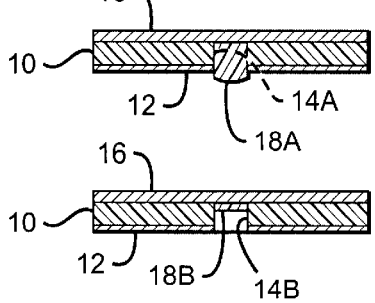
FIG. 4B
FIG. 4C
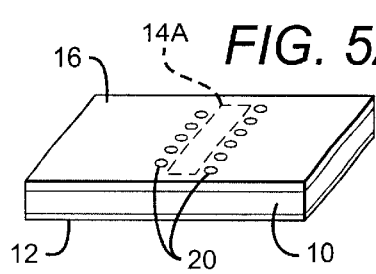
FIG. 5A
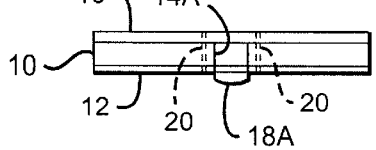
FIG. 5B

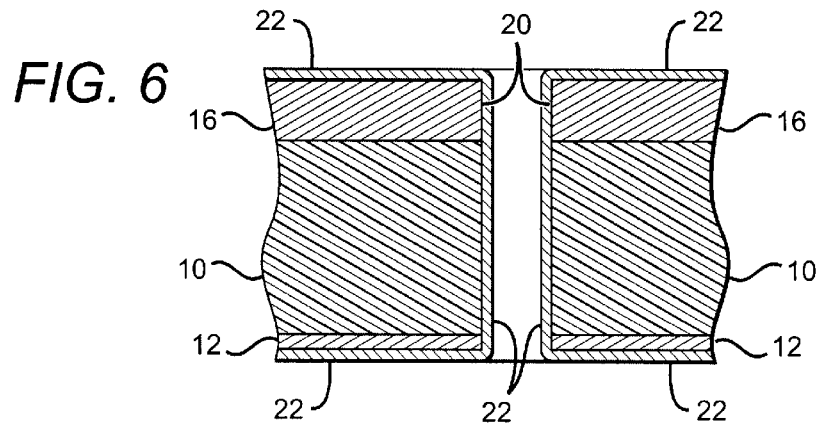
FIG. 6
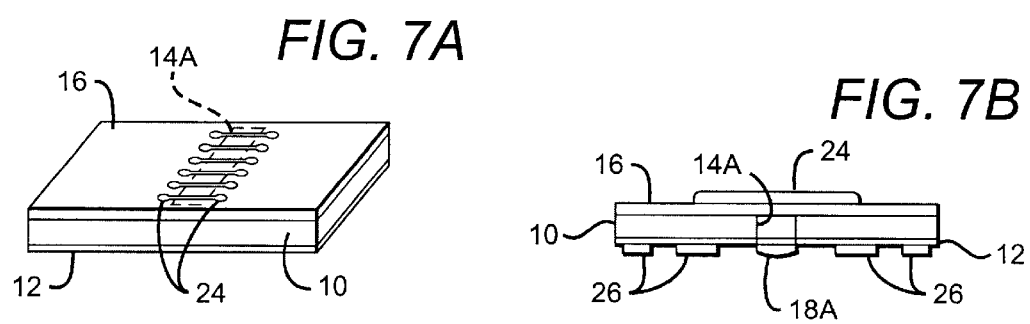
FIG. 7A
FIG. 7B
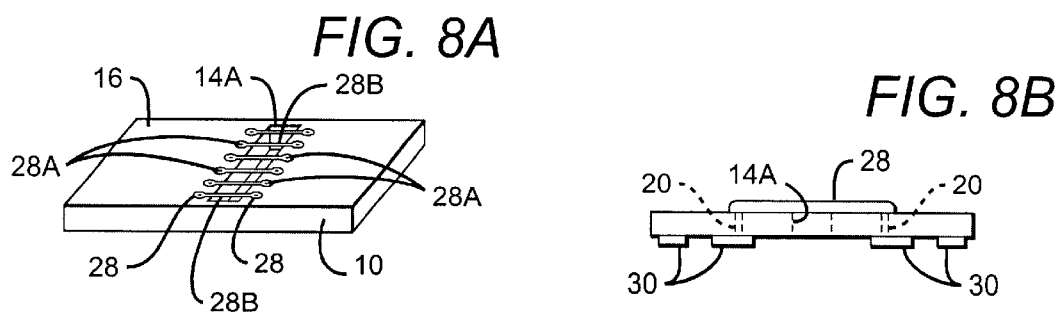
FIG. 8A
FIG. 8B

FIG. 16A
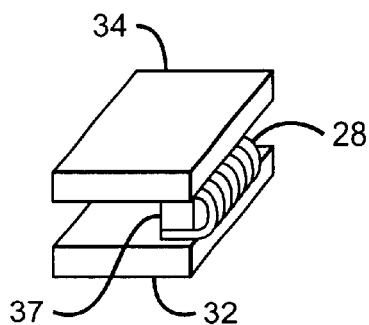
FIG. 16B
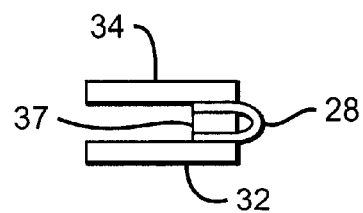
FIG. 17A
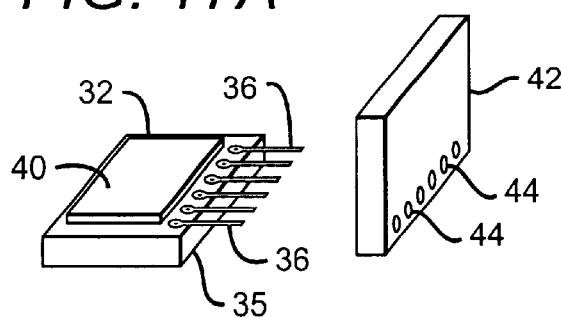
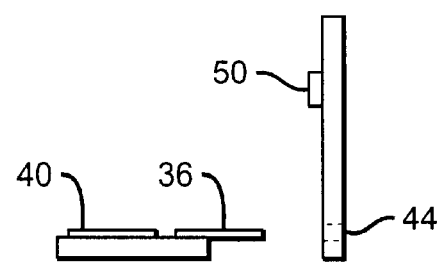
FIG. 17B
FIG. 18
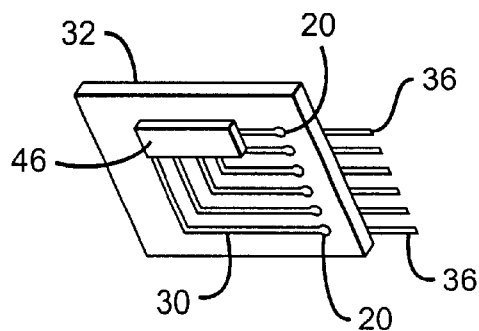

PRINTED CIRCUIT BOARD ELECTRICAL INTERCONNECTS

FIELD OF THE INVENTION

The present invention relates generally to printed circuit boards, such as those commonly used to facilitate electrical interconnection of components in electronic assemblies. The present invention relates more particularly to integrally formed electrical interconnects for printed circuit boards. The electrical interconnects may be configured so as to either provide electrical communication between a plurality of printed circuit boards or so as to define terminations for such printed circuit boards. The electrical interconnects may additionally be configured to define electrical connectors. The present invention also comprises a method for forming such electrical interconnects.

BACKGROUND OF THE INVENTION

Electrical interconnections for facilitating electrical communication between printed circuit boards are well known. Typically, printed circuit boards are electrically interconnected either via flexible conductors, i.e., cables, or via rigid conductors such as the traces of a printed circuit board bus. The use of cables is advantageous in that cables facilitate electrical communication between printed circuit boards having various different orientations with respect to one another. For example, two printed circuit boards may be oriented parallel to one another, perpendicular to one another, or at any other desired relative angle or orientation, when electrically interconnected via cables.

However, the use of such flexible conductors generally requires that cable connectors be fabricated or purchased and then attached, e.g., soldered, to each of the printed circuit boards and that cables with complimentary connectors also be provided. Thus, such electrical interconnection of printed circuit boards via flexible conductors suffers from the inherent disadvantage of increased cost due to the substantial costs of materials and labor associated therewith.

Further, cables do not typically provide a robust electrical connection, i.e., an electrical connection which is desirably reliable and effective. As those skilled in the art will appreciate, the connectors utilized to attach such cables to printed circuit boards inherently introduce substantial problems. The electrical connection of a cable to the complimentary cable connector of a printed circuit board may not be either reliable or effective for several reasons. Mechanical contact between the individual electrical contact members, e.g., pins and sockets, of such cable connectors may not be sufficient to provide the desired electrical connection therebetween. As those skilled in the art will appreciate, good mechanical contact between the electrical contact members of cable connectors is necessary in order to provide the desired electrical interconnection. Poor mechanical contact may be due to poor design and/or bending of the contacts during handling. Further, wear of the electrical contacts due to repeated attachment and detachment of the electrical connectors also commonly results in such poor mechanical contact.

Further, such electrical contacts are subject to degradation caused by environmental factors, such as moisture, air pollutants and soiling. Such degradation of the electrical contracts frequently results in the formation of a high resistance layer thereupon, which substantially inhibits the flow of electric current therethrough. Thus, such degradation of the electrical contacts frequently renders the electrical contracts unsuitable for the reliable transmission of electrical signals. As those skilled in the art will appreciate, even when handled and assembled properly, the reliability of electrical cable connectors is substantially lower than desirable.

Printed circuit board buses for rigidly interconnecting a plurality of separate printed circuit boards are also well known. A common example of such a printed circuit board bus is the ISA/PCI bus of a contemporary IBM compatible personal computer (PC) which is utilized to interconnect a plurality of different printed circuit board add-on cards, such as a display adaptor, a sound card, and/or a modem card with the central processing unit (CPU) and the random access memory (RAM) of the personal computer. Such printed circuit board buses comprise a plurality of female card edge connectors which are rigidly attached to the printed circuit board, i.e., the motherboard of the personal computer. The add-on cards attach to the female card edge connectors via complimentary male card edge connectors formed of conductive traces at an edge of each add-on card. A plurality of conductive conduits or traces extend in a generally parallel fashion between the female card edge connectors and provide electrical communication therebetween.

Although such rigid printed circuit board buses may be somewhat more reliable than flexible cables, since relative movement between the printed circuit boards attached thereby is inhibited by such rigid attachment of the boards to one another, the printed circuit boards attached to such a printed circuit board bus must generally be oriented approximately parallel to one another and must be oriented approximately perpendicular to the printed circuit board upon which the bus is formed. Thus, the physical layout of such printed circuit boards is undesirably constrained. Further, such bus connectors suffer from some of the same inherent deficiencies as cable connectors, i.e., they are subject to degradation caused by moisture, air pollutants and soiling, as well as by handling and wear.

It is desirable to be able to orient printed circuit boards at various different angles with respect to one another. For example, in some instances it may be desirable to provide electrical communication between printed circuit boards which are oriented such that they are parallel to one another. This may be done to minimize the space occupied by the printed circuit boards. In other instances, it may be desirable to provide electrical communication between printed circuit boards which are oriented such that they are perpendicular to one another. They may be done so that each printed circuit board can be mounted to each one of two adjacent perpendicular walls of a rectangular enclosure, for example.

It may even occasionally be desirable to orient printed circuit boards at other desired angles or orientations relative to one another in order to accommodate packaging requirements. For example, it may be necessary to orient one printed circuit board at an angle of approximately 45 degrees with respect to the other printed circuit board in order to accommodate the desired packaging of large components, e.g., transformers, mounted to or near one or both of the printed circuit boards. That is, such large components may prevent orientation of the printed circuit boards parallel to one another and may similarly prevent mounting of a printed circuit board close to the perpendicular walls of an enclosure and thus prevent mounting of the printed circuit boards perpendicular to each other.

In view of the foregoing, it is desirable to provide robust electrical interconnects between printed circuit boards which are oriented at substantially any desired angle with respect to one another.

Additionally, it is frequently desirable to piggyback a small printed circuit board to a larger printed circuit board. This frequently occurs when, for example, the smaller printed circuit board defines a multi-chip module or contains hybrid circuitry, i.e., a combination of discrete and integrated circuit components, and is to be placed in electrical communication with a larger printed circuit board. One common example of such attachment of a small printed circuit board to a larger printed circuit board is the attachment of a random access memory (RAM) module to a personal computer motherboard. Such attachment is typically accomplished by providing a connector (such as a SIMM connector) on the larger printed circuit board for receiving complimentary leads or terminations from the smaller printed circuit board.

Such terminations typically comprise a plurality of pins permanently attached to the smaller printed circuit board and in electrical communication with the electrical components of the smaller printed circuit board. The fabrication of a printed circuit board having pins for facilitating electrical interconnection with another, typically larger, printed circuit board is inherently labor intensive, since holes must typically be drilled in the printed circuit board to receive the pins, the pins must be inserted into the holes and the pins must be soldered in place.

Alternatively, male card edge connectors may be formed upon the smaller printed circuit board and configured to attach to a complimentary female card edge connector which is attached to the larger printed circuit board. Such male card edge connectors comprise a plurality of conductive traces or terminations formed upon a desired edge of the printed circuit board. The traces define parallel fingers that extend to the edge of the printed circuit board and are perpendicular thereto. The parallel finger terminations of a male card edge connector are received within a female card edge connector attached to another, typically larger, printed circuit board and electrical contact is made to the parallel finger terminations of the male card edge connector via spring contacts within the female card edge connector. Such card edge connectors are commonly used to attach add-on daughter cards to the motherboard of an IBM compatible personal computer, for example.

However, as those skilled in the art will appreciate, such contemporary card edge connector terminations suffer from inherent deficiencies. The disadvantages associated with the use of connectors, as discussed above, apply to such card edge connectors. Further, the use of such card edge connectors is limited to generally perpendicular mounting of the printed circuit boards. As those skilled in the art will appreciate, perpendicular mounting is not suitable for all applications. In some instances, packaging requirements dictate that parallel mounting of the printed circuit boards relative to one another be utilized instead. Indeed, packaging requirements may dictate that two printed circuit boards be oriented at various different angles with respect to one another, as discussed above.

It is desirable to provide robust electrical terminations for electrically connecting a printed circuit board or the like to another printed circuit board or to an electrical connector, wherein the terminations are defined integrally with conductive traces formed upon the printed circuit board, so as to reduce manufacturing costs and enhance the reliability thereof.

SUMMARY OF THE INVENTION

The present invention specifically addresses and alleviates the above-mentioned deficiencies associated with the prior art. More particularly, the present invention comprises a method for forming electrical interconnects for printed circuit boards and the like. The interconnects comprise either a plurality of electrical conduits which fixedly attach one printed circuit board to another printed circuit board or conductive conduits (such as terminations) which removably attach one printed circuit board to another printed circuit board or to a cable connector or the like.

The method comprises the steps of laminating a first surface of a rigid dielectric substrate with a first conductive laminate such that the first conductive laminate extends beyond at least one edge of the dielectric substrate (such as an edge defined by a window formed in the dielectric substrate), patterning the first conductive laminate to define a plurality of electrical interconnects which extend beyond the edge(s) of the dielectric substrate, forming a plurality of conductive traces on a second surface of the dielectric substrate and forming a plurality of openings in the dielectric substrate to define vias for electrically interconnecting the interconnects and the conductive traces.

The interconnects, the conductive traces, and the vias may be formed in any desired order. The interconnects facilitate attachment of the printed circuit board to another printed circuit board or to a connector, as discussed in detail below. The conductive traces facilitate electrical communication between electronic components formed upon the printed circuit board, as is common in the art.

Each of the openings extends from a first location on a first surface of the dielectric substrate which is proximate at least one electrical interconnect to a second location on the second surface of the substrate which is proximate at least one conductive trace. Conductive material is formed within the openings of the dielectric substrate such that vias are formed wherein the conductive material facilitates electrical communication between the electrical interconnects formed upon the first surface of the substrate and the conductive traces formed upon the second surface of the substrate.

The step of forming the plurality of conductive traces on the second surface of the dielectric substrate preferably comprises laminating the second surface of the dielectric substrate with a second conductive laminate and patterning the second conductive laminate to define the conductive traces. The conductive traces may alternatively be formed upon the second surface of the dielectric substrate by sputtering, vapor deposition, electroplating or by any other desired process.

Preferably, at least one window is formed within the dielectric substrate and the step of laminating the first surface of the dielectric substrate such that the first conductive laminate extends beyond at least one edge of the dielectric substrate comprises laminating the first surface of the substrate such that the first conductive laminate extends across the window(s). The first conductive laminate thus extends beyond an edge of the dielectric substrate which defines an edge of the window.

The step of forming at least one window(s) in a dielectric substrate preferably comprises forming a window in a dielectric substrate having a layer of conductive material (such as the second conductive laminate) formed upon the second surface thereof such that the window(s) are formed in both the dielectric substrate and the layer of conductive material simultaneously, wherein the conductive traces are subsequently formed from the conductive layer. The step of forming a window in the dielectric substrate preferably comprises dye cutting the window into the dielectric substrate (and simultaneously cutting the window into the layer of conductive material).

Alternatively, the window(s) are formed separately in each of the dielectric substrate and the second conductive laminate, prior to laminating the second surface of the dielectric substrate with the second conductive laminate. Of course, forming window(s) in the dielectric substrate and the second conductive laminate separately necessitates that the window(s) be aligned to one another, prior to laminating the dielectric substrate with the second conductive laminate.

As a further alternative, a window is not formed in the second conductive laminate until a later etching step, wherein conductive traces are also formed from the second conductive laminate.

The steps of patterning the first and second conductive laminates preferably comprise applying resist to the first and second laminates and then acid etching the first and second laminates.

The step of laminating the first surface and the step of forming a plurality of conductive traces on the second surface preferably comprise laminating the first surface with a laminate having a thickness which is different from a thickness of the conductive traces. The laminate of the first surface preferably has a greater thickness than the conductive traces of the second surface. By laminating the first surface with a laminate having a thickness greater than the thickness of the conductive traces, interconnects are formed from the laminate of the first surface which are thicker, and therefore more durable than the conductive traces formed upon the second surface. This is particularly important when the interconnects are to be bent, as when orienting to printed circuit boards at a desired angle relative to one another.

The step of laminating the first surface with a conductive laminate comprises laminating the first surface with a sheet material comprising a substance such as copper, beryllium copper, nickel or brass. The step of forming a plurality of conductive traces on the second surface of the dielectric substrate preferably comprises laminating the second surface of the substrate with a sheet material comprising a substance such as copper, beryllium copper, nickel or brass.

According to the preferred embodiment of the present invention, both the first and second surface of the dielectric substrate are laminated with a conductive material which is attached thereto by adhesive.

The plurality of electrical interconnects may be formed so as to extend between at least two printed circuit boards, so as to facilitate electrical communication between the printed circuit boards. The electrical interconnects may be bent so as to orient the two printed circuit boards at a desired relative position with respect to one another. Thus, the two printed circuit boards may be oriented perpendicular to one another, parallel to one another, or at any other desired angle with respect to one another. When the electrical interconnects are bent such that the two electrical printed circuit boards are generally parallel to one another, the electrical interconnects which connect the two printed circuit boards may optionally be used as a connector, as discussed in detail below.

The step of patterning the first conductive laminate to define a plurality of electrical interconnects optionally comprises patterning the first conductive laminate to define a thermal management interface as well.

The plurality of electrical interconnects may be formed so as to extend from a single printed circuit board (rather than fixedly interconnecting two separate printed circuit boards), so as to define terminations for the printed circuit board. Such terminations may, for example, extend from the printed circuit board such that they are generally perpendicular thereto, similar to the manner in which the legs extend from a dual in-line package (DIP) integrated circuit (IC) chip. Thus, the printed circuit board may be attached to another printed circuit board, via either a socket or directly, in much the same manner that a DIP IC is attached to a printed circuit board.

The terminations may extend from the printed circuit board such that they can be inserted into complimentary holes formed in another printed circuit board, so as to effect electrical interconnection of the two printed circuit boards, as discussed in detail below.

The terminations may optionally be bent into a generally "U" shape so as to enhance use of the terminations with connectors. Such bending of the terminations into a "U" shape increases the structural strength of terminations defined thereby, so as to enhance the reliability thereof. The terminations are preferably bent over a spacer. The spacer optionally comprises the same dielectric material which defines the rigid dielectric substrate.

Alternatively, the terminations may be bent into a gull wing configuration, so as to enhance use of the conductive conduits in surface mount applications. As those skilled in the art will appreciate, such a gull wing configuration provides greater surface area for mounting, thereby enhancing the reliability thereof.

Thus, according to the present invention, an electrical interconnect facilitates electrical communication between two printed circuit boards, either by fixedly attaching two printed circuit boards to one another or by defining a termination which facilitates detachable attachment of one printed circuit board to another. The electrical interconnect comprises a conductive conduit which extends beyond an edge of at least one printed circuit board. The conductive conduit is integrally formed with a conductive trace formed upon the printed circuit board(s). Thus, the conductive conduit which defines the electrical interconnect or the termination is essentially a conductive trace (which is preferably thicker than contemporary conductive traces) which extends beyond an edge of the printed circuit board, and thus extends off of the printed circuit board.

According to the preferred embodiment of the present invention, the electrical interconnects extend from one surface of the printed circuit board, while the conductive traces which electrically interconnect electronic components are formed upon the opposite side of the printed circuit board, so as facilitate fabrication of the comparatively thick electrical interconnects and the comparatively thin conductive traces using two separate conductive laminates of different thicknesses. However, as those skilled in the art will appreciate, the terminations may alternatively be formed upon the same side of the printed circuit board as the conductive traces. Indeed, both electrical interconnects and conductive traces may be formed upon either one or both sides of the printed circuit board, as desired.

A printed circuit board assembly is defined by a plurality of circuit boards and a plurality of electrical interconnects, wherein each electrical interconnect facilitates electrical communication between two of the printed circuit boards. Each electrical interconnect comprises a conductive conduit which extends beyond an edge of the two printed circuit boards.

As discussed below, the electrical interconnects of the present invention may be formed upon any desired layer of a multilayer printed circuit board. Thus, any desired layer of a multilayer printed circuit board may be used to either provide electrical interconnection to another printed circuit board or to define terminations, utilizing the electrical interconnects of the present invention.

The electrical interconnects of the present invention provide for both a robust, electrical interconnection between printed circuit boards which may be oriented substantially at any desired angle with respect to one another and provide robust electrical terminations for electrically connecting a printed circuit board or the like to another printed circuit board or to an electrical connector, wherein the terminations are defined integrally with the conductive traces formed upon the printed circuit board, so as to reduce manufacturing costs and so as to enhance the reliability of the terminations.

BRIEF DESCRIPTION OF THE DRAWINGS

These, and other features, aspects and advantages of the present invention will be more fully understood when considered with respect to the following detailed description, appended claims, and accompanying drawings, wherein:

FIGS. 1A and 1B are a perspective and a side view, respectively, of a dielectric substrate having a thin conductive laminate applied to the bottom thereof;

FIGS. 2A and 2B are a perspective and a side view, respectively, of the dielectric substrate and thin conductive laminate of FIGS. 1A and 1B, having a window formed through both the substrate and the thin conductive laminate;

FIG. 2C is a side view of the dielectric substrate and the thin conductive layer of FIGS. 1A and 1B, showing an alternative procedure wherein the window is formed only in the dielectric substrate and does not extend through the thin conductive layer;

FIGS. 3A and 3B are a perspective and side view, respectively, of the dielectric substrate and thin conductive laminate of FIGS. 2A and 2B, having a thick conductive laminate applied to the upper surface of the substrate so as to cover the window formed in the substrate and thin conductive laminate;

FIGS. 4A and 4B are a perspective and a cross-sectional side view, respectively, of the dielectric substrate, thin conductive laminate and thick conductive laminate of FIGS. 3A and 3B, showing a resist deposited within the window, so as to protect the underside of the thick conductive laminate during subsequent acid etching;

FIG. 4C is a cross-sectional side view of the dielectric substrate and the thin conductive laminate of FIG. 2C, according to the alternative procedure, wherein a layer of resist is formed upon the thick conductive laminate so as to coat that portion of the lower surface of the thick conductive laminate which covers the window, thus protecting the lower surface of the thick conductive laminate when the thin conductive laminate is subsequently acid etched;

FIGS. 5A and 5B are a perspective and a side view, respectively, of the dielectric substrate, thin conductive laminate, and thick conductive laminate of FIGS. 4A and 4B, showing through holes drilled through the substrate, the thin conductive laminate and the thick conductive laminate;

FIG. 6 is an enlarged cross-sectional side view of an exemplary through hole of FIGS. 5A and 5B, showing a thin layer of copper deposited within the through hole and substantially overlapping the surrounding area of the upper surface of the thick conductive laminate and the lower surface of the thin conductive laminate, so as to define a via;

FIGS. 7A and 7B are a perspective and a side view, respectively, of the dielectric substrate, the thin conductive laminate and the thick conductive laminate of FIGS. 5A and 5B, showing a layer of resist patterned upon both the thick conductive laminate and the thin conductive laminate so as to define the interconnects to be formed from the thick conductive laminate and the conductive traces to be formed from the thin conductive laminate;

FIGS. 8A and 8B are a perspective and a side view, respectively, of the dielectric substrate of FIGS. 7A and 7B, after acid etching and removal of the resist, such that conductive interconnects are defined upon the upper surface of the dielectric substrate and conductive traces are defined upon the lower surface of the dielectric substrate;

FIGS. 16A and 16B are a perspective and a side view, respectively, of two printed circuit boards, wherein the electrical interconnects thereof are bent into a generally U-shape as shown in FIGS. 11A and 11B, also having a spacer disposed intermediate the two printed circuit boards;

FIGS. 17A and 17B are a perspective and a side view, respectively, of two printed circuit boards, wherein one printed circuit board has a plurality of terminations extending in a generally straight fashion therefrom, which are configured so as to be inserted into a corresponding plurality of holes in the other printed circuit board, so as to effect electrical interconnection of the two printed circuit boards; and FIG. 18 is a bottom perspective view of the printed circuit board of FIGS. 17A and 17B, showing an electronic component in electrical communication with conductive traces formed thereon.

DETAILED DESCRIPTION OF THE PREFERRED EMBODIMENT

Figure 9A:
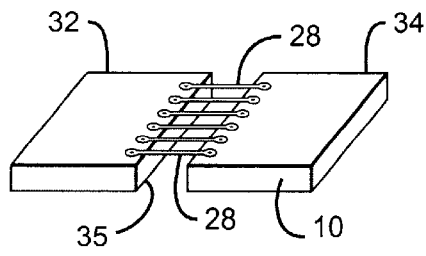
FIGS. 9A and 9B are a perspective and a side view, respectively, of the dielectric substrate of FIGS. 8A and 8B, wherein edge portions thereof have been removed so as to define two separate printed circuit boards which are electrically interconnected via the interconnects formed from the thick conductive laminate.

The detailed description set forth below in connection with the appended drawings is intended as a description of the presently preferred embodiments of the invention and is not intended to represent the only forms in which the present invention may be constructed or utilized. The description sets forth the functions and the sequence of steps for constructing and operating the present invention in connection with the illustrated embodiments. It is to be understood, however, that the same or equivalent functions and sequences may be accomplished by different embodiments that are also intended to be encompassed within the spirit and scope of the invention.

The present invention comprises electrical interconnects which may be configured so as to either provide electrical communication between a plurality of printed circuit boards or so as to define terminations for printed circuit boards. The present invention also comprises a method for forming such electrical interconnects.

When the electrical interconnects are configured so as to provide electrical communication between two printed circuit boards, then the electrical interconnects may be formed so as to orient the two printed circuit boards at a desired angle with respect to one another. Thus, for example, the two printed circuit boards may be oriented generally parallel to one another, generally perpendicular with respect to one another, or at various other desired angles with respect to one another. Further, the two printed circuit boards may be configured in a cascade or any similar configuration.

When the electrical interconnects are configured so as to define terminations for the printed circuit boards, then the terminations may be used to connect the printed circuit board to another printed circuit board, either directly or via a connector attached to the other printed circuit board, or may alternatively be used to connect to a cable.

Referring now to FIGS. 1A and 1B, the method for forming electrical interconnects according to the present invention comprises applying a thin conductive laminate to one surface, e.g., the bottom surface as shown on FIGS. 1A and 1B, of a dielectric substrate 10. The thin conductive laminate 12 is preferably adhesively bonded to the dielectric substrate 10. However, those skilled in the art will appreciate that various other methods, such as electroplating, sputtering and vapor deposition may alternatively be utilized to form a thin layer of conductive material upon the bottom surface of the dielectric substrate 10.

The thin conductive laminate 12 preferably comprises a material such as copper, beryllium copper, nickel, or brass. Those skilled in the art will appreciate that various other conductive materials, e.g., metals or alloys, are likewise suitable.

It is contemplated that dielectric substrate 10 having thin conductive laminate 12 already adhesively bonded thereto may be special ordered and purchased in bulk so as to facilitate the more efficient practice of the present invention.

The formation of only two electrically interconnected printed circuit boards is shown in FIGS. 1A–12B for simplicity. As those skilled in the art will appreciate, a plurality of such pairs of electrically interconnected printed circuit boards may simultaneously be formed from a single dielectric substrate, if desired.

Referring now to FIGS. 2A and 2B, a window 14A is formed through the dielectric substrate 10 and the thin conductive laminate 12. The window is preferably formed via die cutting. Those skilled in the art will appreciate that various other methods for forming such a window are likewise suitable. For example, laser drilling, milling, and/or acid etching may likewise be utilized to form the window 14A through the dielectric substrate 10 and thin conductive laminate 12.

If the window in the thin conductive laminate 12 is formed via acid etching, then resist must subsequently be patterned upon a thick conductive laminate 16 (FIG. 3A), as discussed in detail below.

Alternatively, a window may be formed in the dielectric substrate 10 and the thin conductive laminate 12 prior to adhesive bonding of the thin conductive laminate 12 to the dielectric substrate 10. The windows formed separately in the dielectric substrate 10 and the thin conductive laminate 12 are then carefully aligned prior to adhesively bonding the thin conductive laminate 12 to the dielectric substrate 10.

Referring now to FIG. 2C, according to an alternative procedure, the window 14B is formed only through the dielectric substrate 10 and not through the thin conductive laminate 12 at this particular time. A window is subsequently etched into the thin conductive laminate 12 as discussed below.

Referring now to FIGS. 3A and 3B, a thick conductive laminate 16 is applied to the upper surface of the dielectric substrate 10, preferably via adhesive bonding, so as to cover the window 14A formed in both the dielectric substrate 10 and the thin conductive laminate 12.

This thick conductive laminate is formed during subsequent processing as described in detail below, to define conductive traces upon the upper surface of the dielectric substrate 10 and conductive conduits which extend beyond an edge of the dielectric substrate 10. The conductive conduits are thus formed integrally with the conductive traces of the upper surface of the dielectric substrate 10.

The thin conductive laminate 12 preferably is formed of one-half ounce copper. The thick conductive laminate 16 is preferably formed of 0.010 inch thick copper.

Referring now to FIGS. 4A and 4B, resist 18A is deposited within the window such that the resist 18A covers and protects the lower surface of the thick conductive laminate 16 during subsequent acid etching.

Referring now to FIG. 4C, when the window 14A extends only through the dielectric substrate 10 and not through the thin conductive laminate 12, according to the alternative procedure of FIG. 2C, then a layer of resist 18B is patterned upon the lower surface of the thick conductive laminate 16 where the thick conductive laminate 16 covers the window 14A, so as to protect the lower surface of the thick conductive laminate 16 during subsequent acid etching. Since the window 14A does not go through the thin conductive laminate 12 of FIGS. 2C and 4C, the resist 18B must be patterned upon the lower surface of the thick conductive laminate 16 prior to applying the thick conductive laminate 16 to the dielectric substrate 10. Such pre-application of the resist 18B to the lower surface of the thick conductive laminate 16 necessitates careful alignment of the thick conductive laminate 16 with respect to the dielectric substrate 10 so as to assure that the resist 18B adequately protects the lower surface of the thick conductive laminate 16 during acid etching.

It is important to note that during subsequent acid etching of the thin conductive laminate 12 formed upon the lower surface of the dielectric substrate 10, wherein conductive traces are formed from the thin conductive laminate 12, the portion of the thin conductive laminate 12 corresponding to the window 14B formed in the dielectric substrate 10 is etched away (according to the alternative procedure, wherein the window is not previously formed in the thin conductive laminate 12, as shown in FIGS. 2C and 4C), thereby exposing the bottom surface of the thick conductive laminate 16 to the acid etching solution. Thus, it is necessary to protect the bottom surface of the thick conductive laminate 16 which is disposed immediately over the window 14B formed in the dielectric substrate 10 with resist 18B, so as to prevent undesirable acid etching thereof.

Referring now to FIGS. 5A and 5B, through holes 20 are drilled completely through the dielectric substrate 10, the thin conductive laminate 12 and the thick conductive laminate 16, so as to facilitate the subsequent formation of conductive vias between the upper surface and the lower surface of the dielectric substrate 10 in order to provide electrical communication between interconnects which are to be formed upon the upper surface of the dielectric substrate 10 and conductive traces which are to be formed upon the lower surface thereof, as described in detail below.

Referring now to FIG. 6, each through hole 20 is electroplated with a thin layer of copper 22 which preferably extends substantially upon the upper surface of the thick conductive laminate 16 and upon the lower surface of the thin conductive laminate 12 so as to provide good electrical conduction between interconnects which are to be formed from the thick laminate 16 and conductive traces which are to be formed from the thin laminate 12.

As those skilled in the art will appreciate, various different processes for forming the thin copper layer within the through holes 20 are likewise suitable. For example, panel platting, black hole platting, pattern platting or button platting, may alternatively be utilized as desired.

Referring now to FIG. 7A and 7B, resist 24 is patterned upon the thick conductive laminate 16 and resist 26 is patterned upon the lower surface of the thin conductive laminate 12. The resist 24 patterned upon the upper surface of the thick conductive laminate 16 is formed so as to define the desired interconnects (shown in FIG. 8A). The resist 24 is patterned such that the distal ends of the interconnects defined thereby are proximate and generally surround the through holes 20 defining the conductive vias.

Similarly, the resist 26 patterned upon the lower surface of the thin conductive laminate 12 is formed so as to define the desired conductive traces (shown in FIG. 8B). The resist 26 is likewise patterned such that the distal ends of conductive traces defined thereby are proximate and generally surround the through holes 20 defining the conductive vias. In this manner, the conductive traces are placed in electrical communication with the interconnects.

Referring now to FIGS. 8A and 8B, acid etching and washing away of the remaining resist 24, 26 (FIGS. 7A and 7B) results in the formation of interconnects 28 upon the upper surface of the substrate 10, as defined by that portion of the thick conductive laminate 16 which was not etched away. Similarly, conductive traces 30 are formed upon the lower surface of the dielectric substrate 10, as defined by those portions of the thin conductive laminate 12 which were not etched away.

The thin conductive laminate 12 is preferably acid etched before the thick conductive laminate 16. However, as those skilled in the art will appreciate, the thick conductive laminate 16 may alternatively be etched first or both the thin conductive laminate 12 and the thick conductive laminate 16 may be etched simultaneously.

As those skilled in the art will appreciate, various different types of liquid resists, such as those manufactured by Riston and Dynachem, may be utilized. Further, the use of solder resist is likewise suitable for the practice of the present invention. Indeed, various patterning techniques other than acid etching, such as laser etching, sputtering and vapor deposition may alternatively be utilized in the formation of the electrical interconnects and/or the conductive traces.

Figure 9B:
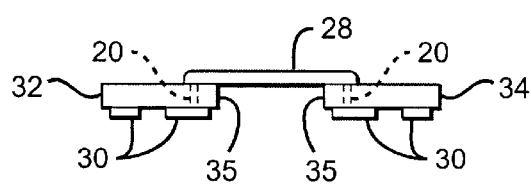

Referring now to FIGS. 9A and 9B, cutting away side portions 31 (FIG. 8A) of the dielectric substrate 10 results in the formation of two separate printed circuit boards 32 and 34 which are electrically interconnected with one another via interconnects 28 and which have conductive traces 30 formed upon the lower surface of the dielectric substrate 10 defining the two printed circuit boards 32 and 34. As those skilled in the art will appreciate, such conductive traces 30 may be utilized to electrically interconnect desired electronic components.

Figure 9C:
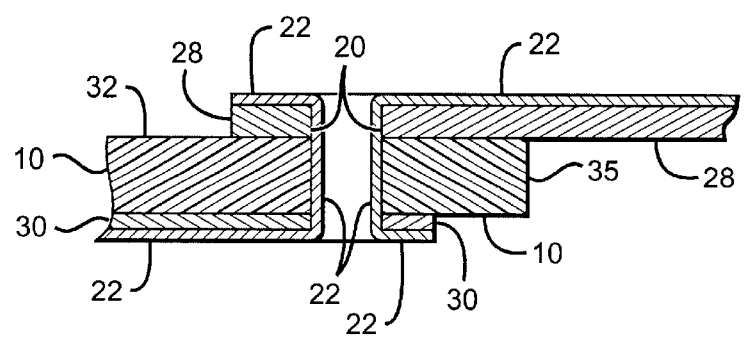
FIG. 9C is an enlarged side view showing a thin layer of copper deposited within a through hole (such as that of FIG. 6) so as to provide electrical communication between the interconnects formed upon the upper surface of the dielectric substrate and the conductive traces formed upon the lower surface of the dielectric substrate, as shown in FIGS. 9A and 9B.

Referring now to FIG. 9C, the electrical interconnects extend beyond an edge 35 of each printed circuit board 32, 34. The edge 35 of each printed circuit board 32, 34 was defined by the window 14, prior to cutting side portions 31 of the dielectric substrate 10 away so as to define the two separate printed circuit boards 32 and 34, as discussed above.

Figure 10A:
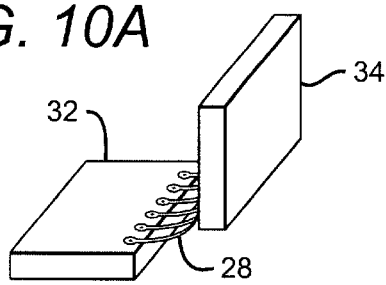
FIGS. 10A and 10B are a perspective and a side view, respectively, of the two printed circuit boards of FIGS. 9A and 9B, wherein the two printed circuits boards have been bent to an angle of approximately 90 degrees with respect to one another.
Figure 10B:
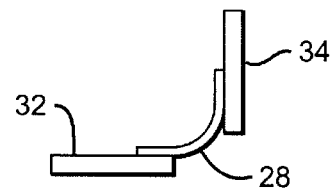

Referring now to FIGS. 10A and 10B, the interconnects 28 may be bent such that the two printed circuit boards 32 and 34 are substantially perpendicular with respect to one another.

Figure 11A:
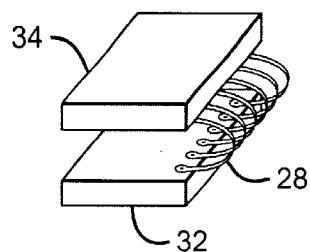
FIG. 11A and 11B are a perspective and a side view, respectively, of the two printed circuit boards of FIGS. 9A and 9B, wherein the printed circuit boards have been bent so as to be oriented approximately parallel with respect to one another.
Figure 11B:
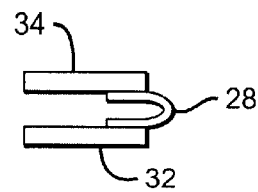

Referring now to FIGS. 11A and 11B, the electrical interconnects 28 may be further bent such that the two printed circuit boards 32 and 34 are substantially parallel with respect to one another.

Of course, the interconnects 28 may be bent such that the two printed circuit boards 32 and 34 are at any other desired angle with respect to one another.

Figure 12A:
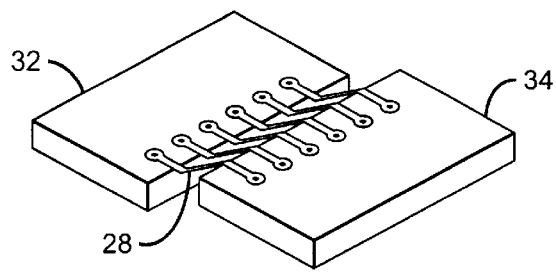
FIGS. 12A and 12B are a perspective and a side view, respectively, of the two printed circuit boards of FIGS. 9A and 9B, wherein the two printed circuits boards have been bent into a cascade configuration.
Figure 12B:
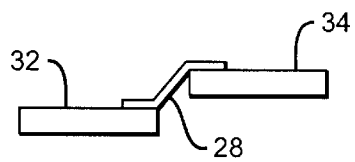

Referring now to FIGS. 12A and 12B, the interconnects 28 are bent such that the two printed circuit boards 32 and 34 are in a cascaded configuration. Such cascaded configuration may be desired when, for example, an electronic component attached to the bottom surface of printed circuit board 34 would otherwise interfere with an enclosure or other electronic component.

Referring now to FIGS. 16A and 16B, a spacer 37, which is optionally comprised of the same material as the dielectric substrate 10, may be disposed intermediate the two printed circuit boards 32 and 34, preferably within the U defined by the electrical interconnects 28. Preferably, the electrical interconnects 28 are bent about the spacer 37. The spacer 37 may optionally be adhesively bonded to one or both of the two printed circuit boards 32 and 34.

The parallel printed circuit boards 32 and 34 which are interconnected by electrical interconnects 28, as shown in FIGS. 11A, 11B, 16A and 16B, may alternatively be utilized as a connector. Thus, the electrical interconnects 28 may be configured so as to mate to a complimentary connector, if desired. When used as a connector, the spacer 37 of FIGS. 16A and 16B is particularly useful, since connectors are typically subject to handling, particularly during the connection and disconnection processes, wherein the additional rigidity provided by the spacer 37 is beneficial.

The right angle configuration of FIGS. 10A and 10B, the parallel configuration of FIGS. 11A and 11B, and the cascade configuration of FIGS. 12A and 12B provide desired flexibility so as to meet difficult packaging requirements. It will be appreciated that various different orientations and configurations of the two printed circuit boards 32 and 34 are likewise achievable according to the present invention.

Referring now to FIGS. 13A–15B, cutting the interconnects 28, preferably proximate the middle thereof, results in the formation of terminations 36 which may be utilized to attach to the printed circuit board 32 to another printed circuit board or an electrical connector, as desired. Various different configurations of the terminations 36 are possible.

Figure 13A:
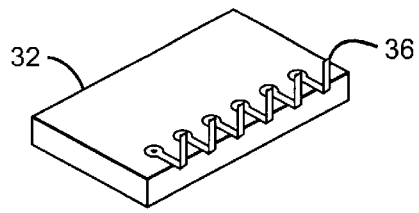
FIGS. 13A and 13B are a perspective and a side view, respectively, of one of the printed circuit boards of FIGS. 9A and 9B, wherein the interconnects have been cut so as to define terminations.
Figure 13B:
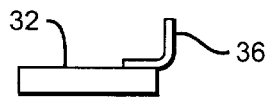

With particular reference to FIGS. 13A and 13B, the terminations 36 may simply be bent so as to be generally perpendicular to the upper surface of the printed circuit board 32. When the terminations 36 are bent so as to be substantially perpendicular to the printed circuit board 32, then the terminations 36 may be used in a manner similar to the legs of a dual in-line package (DIP) integrated circuit (IC) to attach the printed circuit board 32 either directly to another printed circuit board or to a DIP-like connector, which may be attached to another printed circuit board. Alternatively, the terminations 36 may be used to attach the printed circuit board 32 to a cable connector or the like.

Use of the terminations 36 provides a distinct advantage over contemporary printed circuit board mounting methods, such as ball grid array mounting, wherein one printed circuit board is permanently attached to another printed circuit board. Use of the terminations 36 of the present invention in combination with either plated through holes (vias) or printed circuit board mounted connectors facilitates removable attachment of one printed circuit board to another. As those skilled in the art will appreciate, such removable attachment of one printed circuit board to another printed circuit board much more readily facilitates repairs and upgrades. Thus, a multi chip module may be replaced when, for example, newer, faster memory chips and/or a newer, faster CPU is available.

Referring now to FIGS. 17A, 17B, and 18 the terminations 36 may alternatively remain straight, such that they are suitable for insertion into a plurality of similarly spaced holes 44 formed in another printed circuit board 42, so as to effect electrical interconnection of printed circuit board 32 with printed circuit board 42. The holes 44 are preferably plated through, so as to provided reliable electrical interconnection.

Alternatively, the terminations 36 may be inserted into female connector 50.

Optionally, a ground plane or thermal management heat dissipating plane 40 may be formed simultaneously with the formation of the terminations 36 from the same thick conductive lamination 16 (FIGS. 3A and 3B), if desired.

With particular reference to FIG. 18, the terminations 36 electrically communicate with conductive traces 30 formed on the bottom of the printed circuit board 32 via plated through holes 20 which define vias. One or more electrical components 46 are in electrical communication with conductive traces 30. Thus, electrical component(s) 46 are in electrical communication with terminations 36 such that they may be electrically connected to another printed circuit board 42 (FIGS. 17A and 17B), if desired.

Figure 14A:
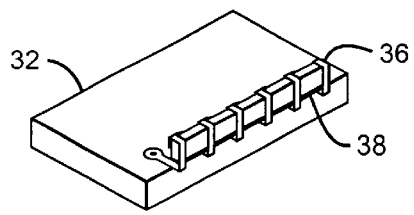
FIGS. 14A and 14B are a perspective and a side view, respectively, of the printed circuit board of FIGS. 13A and 13B, wherein the interconnects have been bent about a spacer, so as to reinforce the structural strength thereof.
Figure 14B:
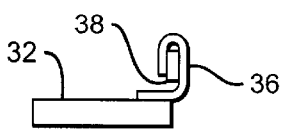

With particular reference to FIGS. 14A and 14B, the terminations 36 may be bent or wrapped about a spacer 38. The spacer 38 preferably comprises an elongate, generally rectangular piece of the same dielectric substrate 10 from which printed circuit board 32 is formed. Alternatively, the spacer 38 may comprise a dielectric material sized and configured so as to provide the desired termination 36 configuration.

Figure 15A:
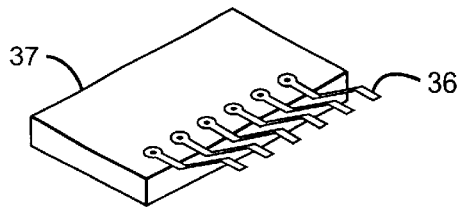
FIGS. 15A and 15B are a perspective and a side view, respectively, of a printed circuit board wherein the terminations have been bent into a gull wing configuration.
Figure 15B:

With particular reference to FIGS. 15A and 15B, the terminations 36 may alternatively be bent so as to form a gull wing configuration. As those skilled in the art will appreciate, such a gull wing configuration is particularly suitable for surface mounting of the printed circuit board 32, wherein the printed circuit board 32 is electrically attached, e.g., soldered, to another, typically larger, printed circuit board, such as the mother board of a personal computer.

The electrical interconnects of the present invention, whether configured to attach two or more printed circuit boards or configured as terminations, may be formed upon multilayer printed circuit boards and may be formed to any desired layer thereof. One way of forming such a multilayer printed circuit board having electrical interconnects of the present invention is to form a printed circuit board as shown in FIGS. 8A and 8B, and then to add additional substrate and conductive layers thereto.

It is important to note that the electrical interconnects and terminations of the present invention are defined by conductive conduits which are integrally formed with traces formed upon a surface of the dielectric substrate. Thus, the electrical interconnects and terminations are contiguous with such traces. Moreover, the electrical interconnects and terminations are defined by traces which extend beyond the edge of a printed circuit board, such that the traces defining the electrical interconnects and terminations are not formed upon the printed circuit board, but rather project therefrom.

It is understood that the exemplary interconnects described herein and shown in the drawings represent only a presently preferred embodiment of the invention. Indeed, various modifications and additions may be made to such embodiment without departing from the spirit and scope of the invention. For example, those skilled in the art will appreciate that various steps of the above described procedure may be performed in different sequences from those described. Further, some of the materials utilized may be purchased having one or more of the steps already performed. For example, the dielectric substrate 10 and thin conductive laminate 12 of FIGS. 1A and 1B may be purchased wherein the conductive laminate 12 has already been applied to the dielectric substrate 10. The through holes 20 defining the conductive vias which interconnect the electrical interconnects 28 and the conductive traces 30 may alternatively be formed after the formation of the interconnects 28 and the conductive traces 30. Thus, these and other modifications and additions may be obvious to those skilled in the art and may be implemented to adapt the present invention for use in a variety of different applications.

What is claimed is:

1. A device comprising:
   a rigid dielectric layer;
   a window in the dielectric layer; and
   at least two interconnects; wherein
   each of the at least two interconnects has a first segment bonded to the dielectric layer on a first side of the window, and a second segment bonded to the dielectric layer on a second side of the window;
   a portion of each of the at least two interconnects located between the first and second segments extends across the window between the first and second sides of the window;
   the at least two interconnects do not cover the entire window, and
   the device comprises at least two through holes extending through a first of the at least two interconnects and the dielectric layer, wherein one of the at least two through holes extends through the first segment of the first interconnect, and the second through hole extends through the second segment of the first interconnect.

2. The device of claim 1 wherein each through hole comprises a layer of conductive plating which is bonded to at least a portion of the sides of the through hole where it passes through the dielectric layer, and to an upper surface of the first interconnect, the upper surface being opposite a lower surface of the first interconnect which is bonded to the dielectric layer.

3. The device of claim 2 wherein the first and second segments are laminated onto the dielectric layer.

4. The device of claim 3 wherein the at least two interconnects comprise copper.

5. A device comprising:
- a rigid dielectric layer;
- a window in the dielectric layer; and
- at least two interconnects; wherein
    - each of the at least two interconnects has a first segment bonded to the dielectric layer on a first side of the window, and a second segment bonded to the dielectric layer on a second side of the window;
    - a portion of each of the at least two interconnects located between the first and second segments extends across the window between the first and second sides of the window;
    - the at least two interconnects do not cover the entire window; each of the at least two interconnects has the same relationships to the window, dielectric layer, and through holes and the same characteristics as the first interconnect;
    - the dielectric layer comprises at least two segments forming at least two sides of the window; and
    - the at least two segments of the dielectric layer are coupled together only by the at least two interconnects.

6. The device of claim 5 further comprising at least two through holes extending through a first of the at least two interconnects and the dielectric layer, wherein one of the at least two through holes extends through the first segment of the first interconnect, and the second through hole extends through the second segment of the first interconnect.

7. The device of claim 6 wherein each through hole comprises a layer of conductive plating which is bonded to at least a portion of the sides of the through hole where it passes through the dielectric layer, and to an upper surface of the first interconnect, the upper surface being opposite a lower surface of the first interconnect which is bonded to the dielectric layer.

8. The device of claim 5 wherein the first and second segments of each of the at least two interconnects are laminated onto the dielectric layer.

9. The device of claim 5 wherein the at least two interconnects comprise a substance selected from the group consisting of:
- copper;
- beryllium copper;
- nickel; and
- brass.

10. The device of claim 5 wherein the at least two interconnects have a thickness which is greater than a thickness of at least one conductive trace formed upon the dielectric layer.

* * * * *